(12) United States Patent
Takaike (10) Patent No.: US 6,903,646 B2
(45) Date of Patent: Jun. 7, 2005

(54) INDUCTOR DEVICE AND ELECTRONIC CIRCUIT DEVICE THAT CAN ACHIEVE FURTHER INTEGRATION WHILE MAINTAINING A HIGH INDUCTANCE

(75) Inventor: Eiji Takaike, Nagano (JP)

(73) Assignee: Shinko Electric Industries Co., Ltd., Nagano (JP)

( * ) Notice: Subject to any disclaimer, the term of this patent is extended or adjusted under 35 U.S.C. 154(b) by 0 days.

(21) Appl. No.: 10/814,717

(22) Filed: Mar. 31, 2004

(65) Prior Publication Data

US 2004/0207502 A1 Oct. 21, 2004

(30) Foreign Application Priority Data

Apr. 16, 2003 (JP) ........................................ 2003-111716

(51) Int. Cl.$^7$ ................................................. H01F 5/00
(52) U.S. Cl. ...................... 336/200; 336/223; 336/225; 336/232
(58) Field of Search ................................. 336/200, 223, 336/225, 232, 65, 15, 51; 357/51

(56) References Cited

U.S. PATENT DOCUMENTS 5,095,357 A * 3/1992 Andoh et al. ................ 257/379
6,456,183 B1 * 9/2002 Basteres et al. ............ 336/200

FOREIGN PATENT DOCUMENTS

JP   03-089548   4/1991

* cited by examiner

*Primary Examiner*—Lincoln Donovan
*Assistant Examiner*—Jennifer A. Poker
(74) *Attorney, Agent, or Firm*—Ladas & Parry LLP

(57) ABSTRACT

An inductor device includes first and second spiral conductors. First and second external connection terminals are formed in inner peripheral ends of the first and second spiral conductors, respectively. A third conductor connects an outer peripheral end of the first spiral conductor and that of the second spiral conductor to each other.

10 Claims, 7 Drawing Sheets

INDUCTOR DEVICE AND ELECTRONIC CIRCUIT DEVICE THAT CAN ACHIEVE FURTHER INTEGRATION WHILE MAINTAINING A HIGH INDUCTANCE

BACKGROUND OF THE INVENTION

1. Field of the Invention

The present invention relates to inductor devices formed by a spiral conductor.

2. Description of the Related Art

Conventionally, in a semiconductor integrated circuit, a spiral conductor is formed on a substrate by using a thin-film deposition technique, for example, and such a spiral conductor is used as an inductor device. It is required for the inductor device to operate stably even if a high-frequency signal flows through the inductor device. In order to fulfill such a requirement, it is necessary to increase inductance of the inductor device. Generally, the inductance of an inductor device is increased proportional to the number of times a conductor is wound around.

When the number of turns of a spiral conductor is increased, however, the area of a substrate occupied by the inductor device (spiral conductor) is increased. Hence, conventionally, spiral conductors are formed in two stages and connected to each other so as to increase the inductance while avoiding an increase in the area of the substrate occupied by the inductor devices (spiral conductors) (refer to Japanese Laid-Open Patent Application No. 3-89548, for example).

However, the inductor device, which is disclosed in Japanese Laid-Open Patent Application No. 3-89548 and formed in two stages, has a so-called peripheral shape, and an external connection terminal is formed at an outer peripheral end of the inductor device (spiral conductor). Hence, it is necessary to provide a region for forming the external connection terminal in the periphery of a region where the spiral conductor is formed, which prevents further integration.

SUMMARY OF THE INVENTION

A general object of the present invention is to provide an improved and useful inductor device in which one or more of the above-mentioned problems are eliminated.

Another and more specific object of the present invention is to provide an inductor device capable of achieving further integration while maintaining a high inductance.

In order to achieve the above-mentioned objects, according to one aspect of the present invention, there is provided an inductor device including:

a first spiral conductor;

a first external connection terminal formed in an inner peripheral end of the first spiral conductor;

a second spiral conductor;

a second external connection terminal formed in an inner peripheral end of the second spiral conductor; and a third conductor connecting an outer peripheral end of the first spiral conductor and an outer peripheral end of the second spiral conductor to each other.

In an embodiment of the present invention, an external connection terminal may be formed in an inner peripheral end of a spiral conductor. Hence, it is unnecessary to provide a region for forming the external connection terminal in the periphery of the region where the spiral conductor is formed, and it is possible to achieve further integration. Additionally, by forming such spiral conductors in two stages and connecting the spiral conductors to each other, it is possible to avoid increasing the area occupied by the inductor device (spiral conductors).

In an embodiment of the present invention, in the above-mentioned inductor device, the first spiral conductor and the second spiral conductor may be formed in a stacked manner via an insulating layer.

In an embodiment of the present invention, the first spiral conductor may be formed on a substrate.

In an embodiment of the present invention, the second spiral conductor may be formed by a gold wire.

In a case where the first spiral conductor is formed on a substrate, and the second spiral conductor is formed above the first spiral conductor via an insulating layer, the second spiral conductor is exposed. Hence, by forming the second spiral conductor by a gold wire, it is possible to prevent corrosion of the second spiral conductor even if the second spiral conductor is exposed to the outside.

In an embodiment of the present invention, the first spiral conductor may be substantially aligned with the spiral space of the second spiral conductor when viewed from a direction perpendicular to the plane in which the first spiral conductor lies.

In a case where the first spiral conductor is substantially aligned with the spiral space of the second spiral conductor when viewed from a direction perpendicular to the plane in which the first spiral conductor lies, it is possible to inhibit the entering of noise and it is possible to stabilize the operation of the inductor device.

According to another aspect of the present invention, there is provided an electronic circuit device including;

a substrate; and an inductor device comprising:

a first spiral conductor;

a first external connection terminal formed in an inner peripheral end of the first spiral conductor;

a second spiral conductor;

a second external connection terminal formed in an inner peripheral end of the second spiral conductor; and a third conductor connecting an outer peripheral end of the first spiral conductor and an outer peripheral end of the second spiral conductor, the inductor device being arranged on the substrate.

Other objects, features and advantages of the present invention will become more apparent from the following detailed description when read in conjunction with the following drawings.

DETAILED DESCRIPTION OF THE PREFERRED EMBODIMENTS

A description is given below of preferred embodiments of the present invention, with reference to the drawings.

(First Embodiment)

FIGS. 1 through 4 are perspective views for explaining manufacturing processes of a first electronic circuit device on which an inductor device is arranged. In a first process shown in FIG. 1, a semiconductor substrate 100 having an integrated circuit (not shown) is formed, and a plurality of electrodes 102 are formed on a top surface of the semiconductor substrate 100. The semiconductor substrate 100 may be made of a material such as silicon, gallium arsenide, and germanium. The electrodes 102 are formed, for example, at the same time as when the integrated circuit (not shown) is formed on the semiconductor substrate 100.

Figure 1:
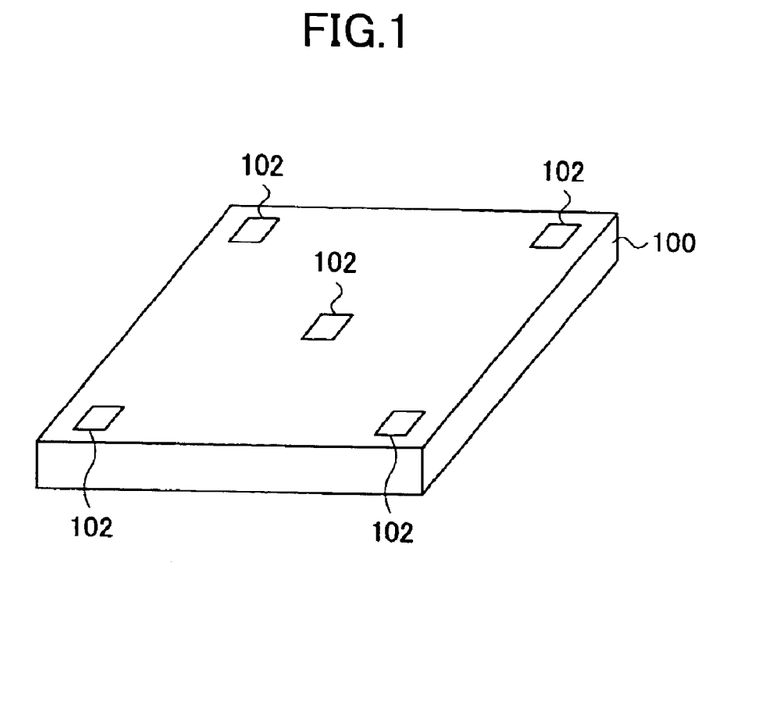
FIG. 1 is a perspective view for explaining a first manufacturing process of an electronic circuit device according to a first embodiment of the present invention.
Figure 2:
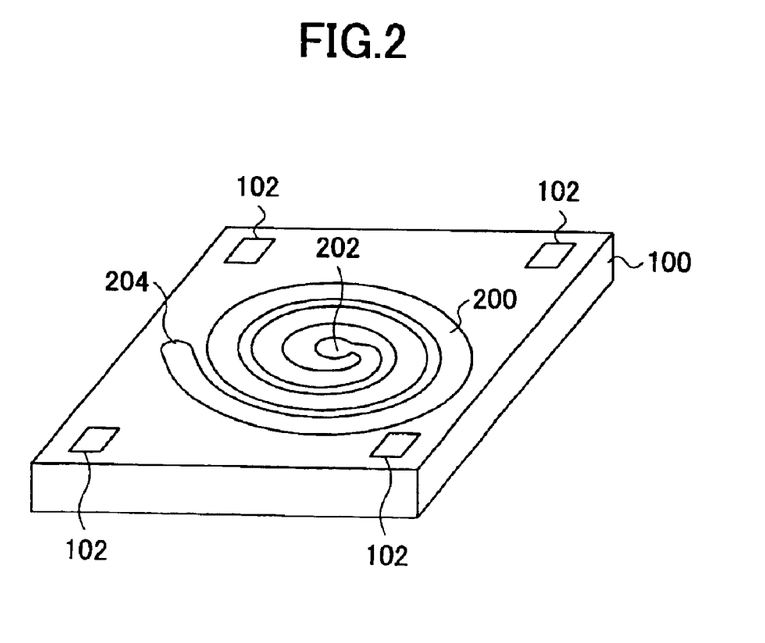
FIG. 2 is a perspective view for explaining a second manufacturing process of the electronic circuit device according to the first embodiment of the present invention.

In a second process shown in FIG. 2, a spiral conductive pattern 200 is formed on the top surface of the semiconductor substrate 100. On this occasion, an inner periphery end 202 of the spiral conductive pattern 200 is formed on a top surface of one of the electrodes 102 formed on the top surface of the semiconductor substrate 100. As a result, the inner periphery end 202 serves as an external connection terminal.

The conductive pattern 200 is made of, for example, copper or gold. A subtractive method, a semi-additive method, or a full-additive method, for example, may be used as the formation method of the conductive pattern 200. The subtractive method is a method in which a conductive layer is formed on the top surface of the semiconductor substrate 100 by sputtering or plating, a photosensitive etching resist film or a metal resist film is formed on a top surface of the conductive layer, and the conductive layer is removed by an etching method except for the portion corresponding to the spiral conductive pattern 200. The semi-additive method is a method in which electroless plating is performed on the top surface of the semiconductor substrate 100, the portion where the spiral conductive pattern 200 is to be formed is exposed by plating resist, and an electrolytic plating film is grown only in the portion where the spiral conductive pattern 200 is to be formed while using the exposed electroless plating film as an electrode. The full-additive method is a method in which plating resist is exposed and developed, thereby forming an opening at a portion where the spiral conductive pattern 200 is to be formed, and electroless plating is grown only at the opening.

Figure 3:
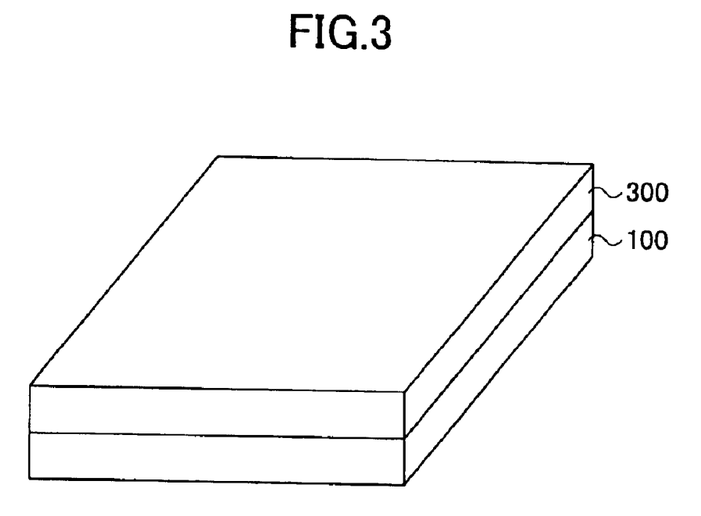
FIG. 3 is a perspective view for explaining a third manufacturing process of the electronic circuit device according to the first embodiment of the present invention.

In a third process shown in FIG. 3, an insulating layer 300 is applied on the top surface of the semiconductor substrate 100 on which the conductive pattern 200 is formed. It is preferable to use varnished polyimide having a high viscosity as a material of the insulating layer 300. Varnished polyimide is advantageous in that good planarity and smoothness are obtained, and minute wiring can be formed.

Figure 4:
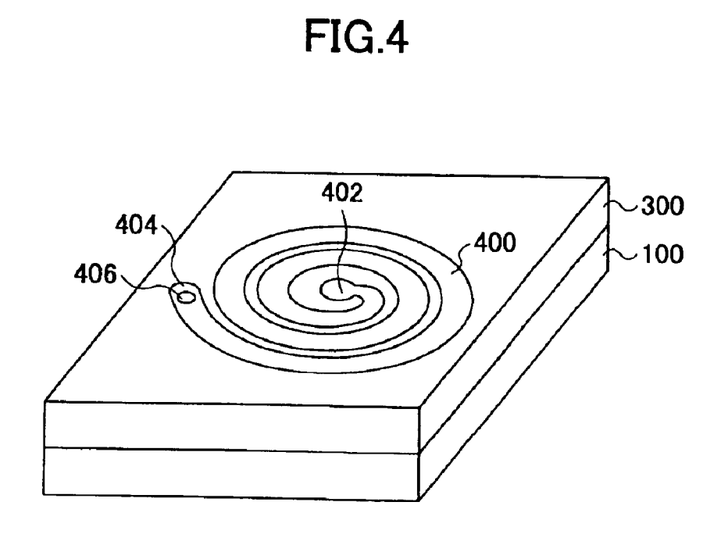
FIG. 4 is a perspective view for explaining a fourth manufacturing process of the electronic circuit device according to the first embodiment of the present invention.

In a fourth process shown in FIG. 4, a spiral conductive pattern 400 is formed on a top surface of the insulating layer 300. An inner periphery end 402 of the spiral conductive pattern 400 serves as an external connection terminal. An outer peripheral end 404 of the spiral conductive pattern 400 and an outer peripheral end 204 of the spiral conductive pattern 200 are arranged along a vertical line. Since the conductive pattern 400 is exposed to the outside, the conductive pattern 400 is made of a corrosion-inhibiting material such as gold. Similarly to the conductive pattern 200, the subtractive method, the semi-additive method, or the full-additive method, for example, may be used as the formation method of the conductive pattern 400.

A conductor 406 is formed in the outer peripheral end 404 of the spiral conductive pattern 400 as a via that connects the outer peripheral end 404 and the outer peripheral end 204 of the spiral conductive pattern 200. Consequently, the spiral conductive pattern 200 and the spiral conductive pattern 400 function as a single inductor device.

Figure 5:
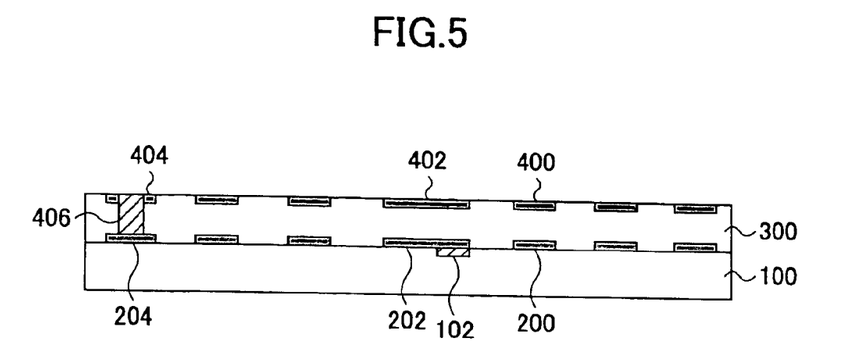
FIG. 5 is a first cross-sectional view of the electronic circuit device according to the first embodiment of the present invention.
Figure 6:
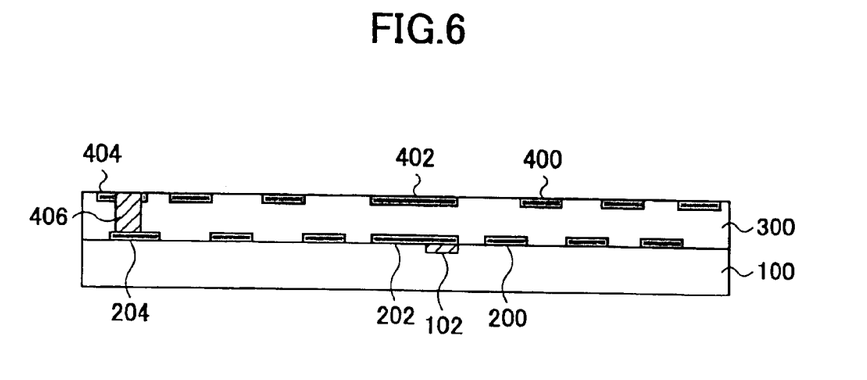
FIG. 6 is a second cross-sectional view of the electronic circuit device according to the first embodiment of the present invention.
Figure 7:
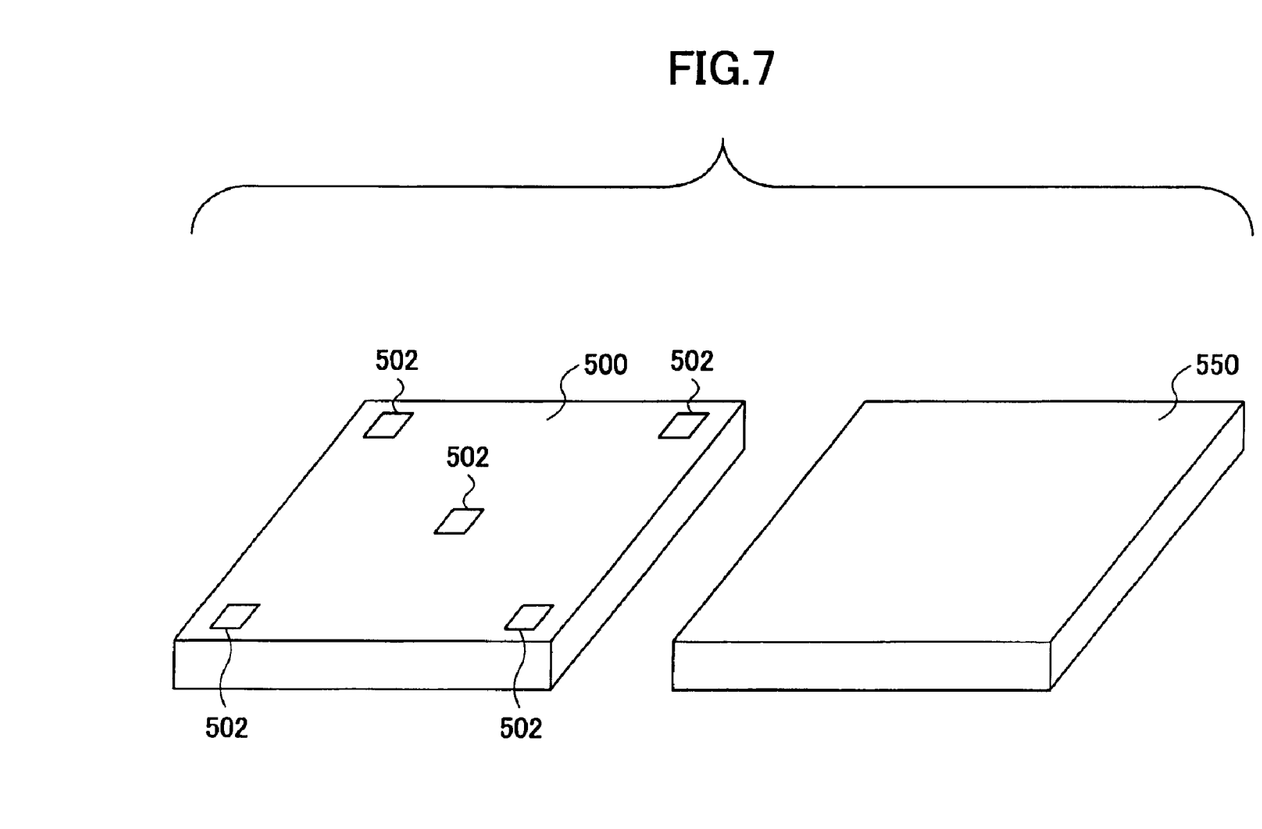
FIG. 7 is a perspective view for explaining a first manufacturing process of an electronic circuit device according to a second embodiment of the present invention.

FIGS. 5 and 6 are cross-sectional views of the first electronic circuit device manufactured by the first through fourth processes shown in FIGS. 1 through 4. In the structure shown in FIG. 5, the spiral conductive pattern 200 and the spiral conductive pattern 400 are formed along a vertical line. On the other hand, in the structure shown in FIG. 6, the spiral conductive pattern 200 is substantially aligned with the spiral space of the spiral conductive pattern 400 when viewed from a direction perpendicular to the insulating layer 300 (the spiral conductive pattern 200 and the spiral conductive pattern 400 are formed alternately with substantially no space in between when viewed from the direction perpendicular to the insulating layer 300). When the structure as shown in FIG. 6 is used, it becomes possible to inhibit the entering of noise and stabilize the operation of the inductor device.

Comparing an inductor device formed by a single spiral conductive pattern and the above-mentioned inductor device in which the spiral conductive pattern 200 and the spiral conductive pattern 400 are stacked, provided that the inductances of the two inductance devices are the same, the latter inductance device occupies a lesser area on the substrate. In addition, in the inductor device formed by stacking the spiral conductive pattern 200 and the spiral conductive pattern 400, the external connection terminals are formed at the inner peripheral end 202 of the spiral conductive pattern 200 and the inner peripheral end 402 of the spiral conductive pattern 400. Accordingly, it is unnecessary to provide a separate region for forming the external connection terminals in the peripheries of the regions where the spiral conductive pattern 200 and the spiral conductive pattern 400 are formed, and it is possible to achieve further integration.

It should be noted that, by reducing the pattern lengths and increasing the widths of the spiral conductive patterns 200 and 400, it is possible to increase a Q value, which is a quantity representing the sharpness of resonance of a tuning circuit. In this case, even if a high frequency signal passes through the inductor device, it is possible to stabilize the operation of the inductor device.

(Second Embodiment)

FIGS. 7 through 10 are perspective views for explaining manufacturing processes of a second electronic circuit device where an inductor device is arranged. In a first step shown in FIG. 7, two resin substrates 500 and 550 are formed, and a plurality of electrodes 502 penetrating the resin substrate 500 are formed therein. The electrodes 502 are formed by forming openings in the resin substrate 500 by drill processing and pouring a conductive paste into the openings formed in a resist film.

Figure 8:
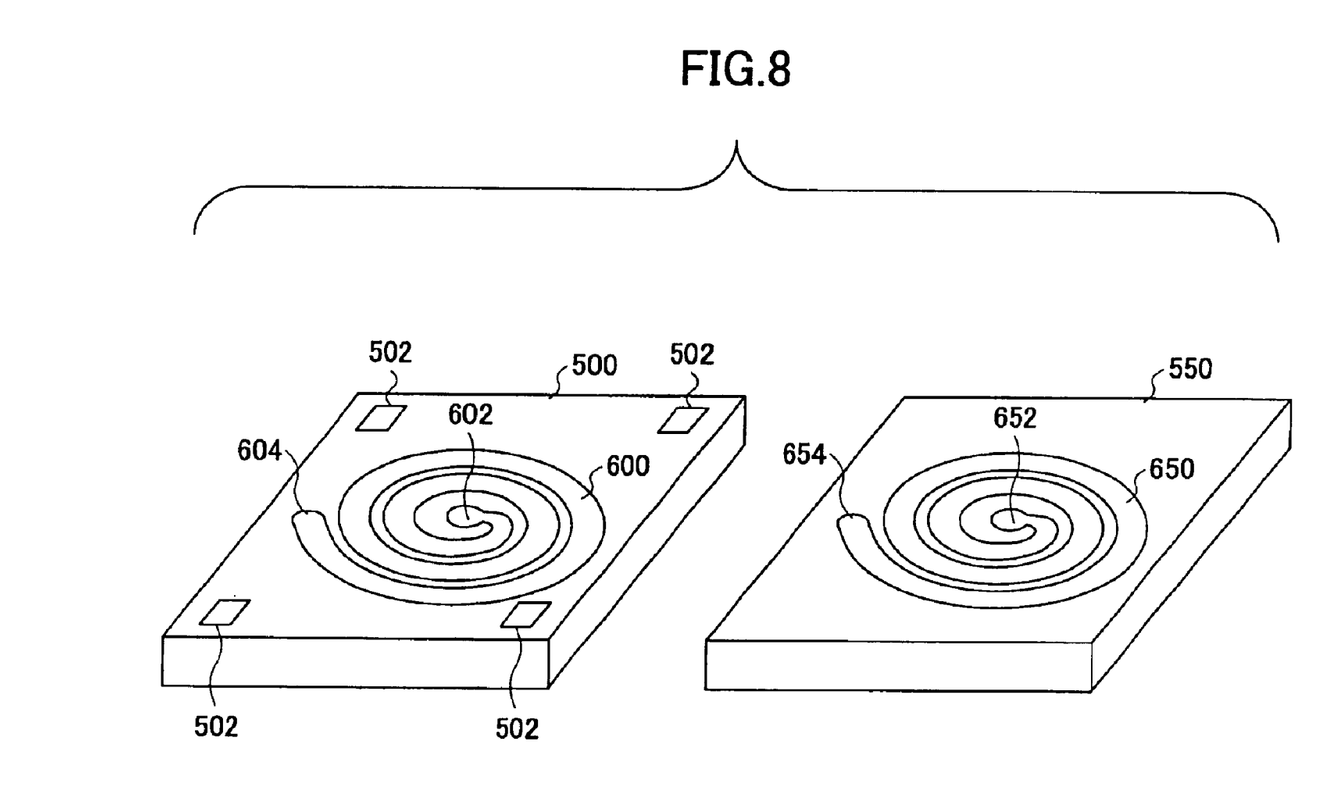
FIG. 8 is a perspective view for explaining a second manufacturing process of the electronic circuit device according to the second embodiment of the present invention.

In a second process shown in FIG. 8, a spiral conductive pattern 600 is formed on a top surface of the resin substrate 500. On this occasion, an inner peripheral end 602 of the spiral conductive pattern 600 is formed on a top surface of one of the electrodes 502 formed on the top surface of the resin substrate 500. As a result, the inner peripheral end 602 serves as an external connection terminal. The spiral conductive pattern 600 is made of, for example, copper or gold.

A spiral conductive pattern 650 is formed on a top surface of the resin substrate 550. Since the spiral conductive pattern 650 is exposed to the outside, the spiral conductive pattern 650 is made of a corrosion-inhibiting material such as gold. The inner peripheral end 652 serves as an external connection terminal. Similarly to the first embodiment, the subtractive method, the semi-additive method, or the full-additive method, for example, may be used as the formation method of the spiral conductive patterns 600 and 650.

Figure 9:
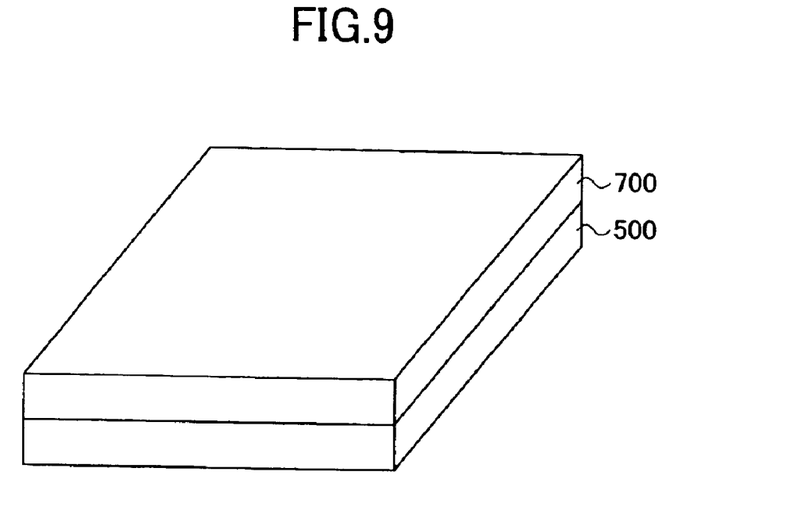
FIG. 9 is a perspective view for explaining a third manufacturing process of the electronic circuit device according to the second embodiment of the present invention.

In a third process shown in FIG. 9, a pre-preg 700 is formed on a top surface of the resin substrate 500 on which the spiral conductive pattern 600 is formed. The pre-preg 700 is formed by mixing, beating, and curing a polymeric material and a ferrite material, for example.

Figure 10:
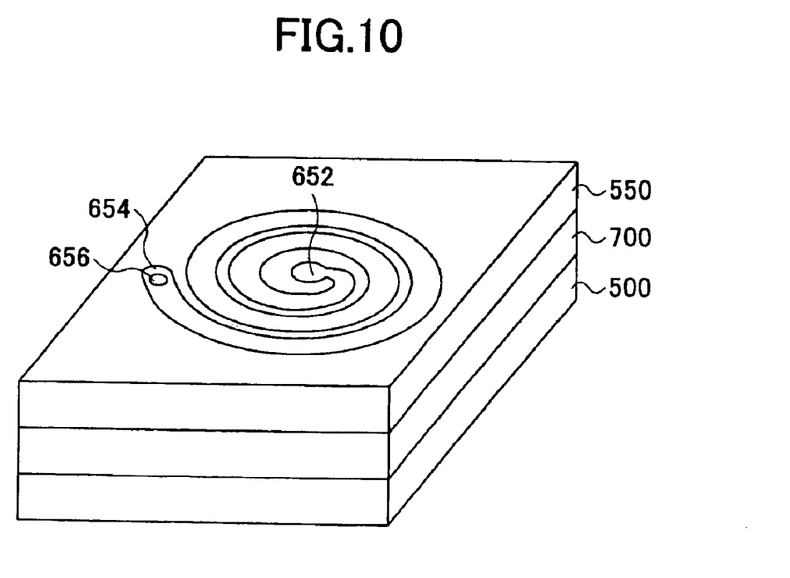
FIG. 10 is a perspective view for explaining a fourth manufacturing process of the electronic circuit device according to the second embodiment of the present invention.

In a fourth process shown in FIG. 10, the resin substrate 550 on which the spiral conductive pattern 650 is formed is stacked on the pre-preg 700. On this occasion, an outer peripheral end 654 of the spiral conductive pattern 650 and an outer peripheral end 604 of the spiral conductive pattern 600 are arranged along a vertical line.

Additionally, a conductor 656 is formed in the outer peripheral end 654 of the spiral conductive pattern 650 as a via that connects the outer peripheral end 654 and the outer peripheral end 604 of the spiral conductive pattern 600. Consequently, the spiral conductive pattern 600 and the spiral conductive pattern 650 function as a single inductor device.

Figure 11:
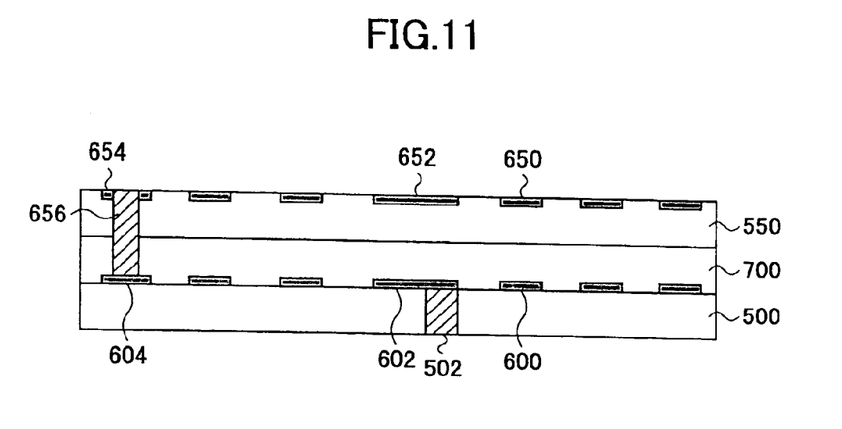
FIG. 11 is a first cross-sectional view of the electronic circuit device according to the second embodiment of the present invention.
Figure 12:
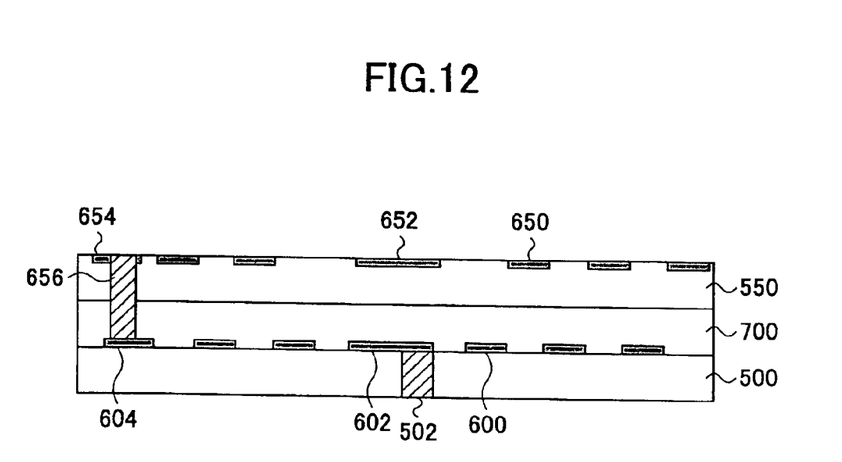
FIG. 12 is a second cross-sectional view of the electronic circuit device according to the second embodiment of the present invention.

FIGS. 11 and 12 are cross-sectional views of the second electronic circuit manufactured after the first through fourth processes shown in FIGS. 7 through 10, respectively. In the structure shown in FIG. 11, the spiral conductive pattern 600 and the spiral conductive pattern 650 are formed along a vertical line. On the other hand, in the structure shown in FIG. 12, the spiral conductive pattern 600 is aligned with the spiral space of the spiral conductive pattern 650 when viewed from a direction perpendicular to the resin substrate 550. When the structure as shown in FIG. 12 is used, similarly to the case where the structure as shown in FIG. 6 is used, it is possible to inhibit entering of noise and stabilize the operation of the inductor device.

Similarly to the first embodiment, also in this embodiment, comparing an inductive device formed by a single conductive pattern and the above-mentioned inductor device in which the spiral conductive pattern 600 and the spiral conductive pattern 650 are stacked, provided that the inductances of the two inductance devices are the same, the latter inductor device occupies less area on a substrate. In the inductor device in which the spiral conductive pattern 600 and the spiral conductive pattern 650 are stacked, the external connection terminals are formed in the inner peripheral end 602 of the spiral conductive pattern 600 and the inner peripheral end 652 of the spiral conductive pattern 650. Accordingly, it is unnecessary to provide a separate region for forming the external connection terminals in the peripheries of the spiral conductive patterns 600 and 650, and it is possible to achieve further integration.

It should be noted that, by decreasing the pattern lengths and increasing the widths of the spiral conductive patterns 600 and 650, it is possible to increase a Q value, which is an amount representing the sharpness of resonance of a tuning circuit. In this case, even if a high frequency signal passes through the inductor device, it is possible to stabilize the operation of the inductor device.

As mentioned above, by using the inductor device according to the first or second embodiment, even if the area occupied by the inductor device on a substrate is small, it is possible to increase the inductance. Hence, it is possible to reduce the number of components such as a band-pass filter and a SAW (surface acoustic wave) filter.

In each of the above-mentioned embodiments, the spiral conductive pattern (200, 400, 600, 650) is formed on the top surface of the semiconductor substrate (100) or the resin substrate (500, 550). However, this is not a limitation and the present invention may be similarly applied to cases where a spiral conductive pattern is formed on a top surface of an interposer substrate or a flexible substrate, for example.

According to the present invention, it is possible to realize an inductor device capable achieving further integration while maintaining a high inductance.

The present invention is not limited to the specifically disclosed embodiments, and variations and modifications may be made without departing from the scope of the present invention.

The present application is based on Japanese priority application No. 2003-111716 filed on Apr. 16, 2003, the entire contents of which are hereby incorporated by reference.

What is claimed is:

1. An inductor device, comprising:
   a first spiral conductor;
   a first external connection terminal formed in an inner peripheral end of said first spiral conductor;
   a second spiral conductor;
   a second external connection terminal formed in an inner peripheral end of said second spiral conductor; and
   a third conductor connecting an outer peripheral end of said first spiral conductor and an outer peripheral end of said second spiral conductor to each other,
   wherein the first and second external connection terminals are formed within regions where the first and second spiral conductors are formed, respectively.

2. The inductor device as claimed in claim 1, wherein the first spiral conductor and the second spiral conductor are formed in a stacked manner via an insulating layer.

3. The inductor device as claimed in claim 2, wherein the first spiral conductor is formed on a substrate.

4. The inductor device as claimed in claim 3, wherein the second spiral conductor is formed by a gold wire.

5. The inductor device as claimed in claim 1, wherein the first spiral conductor is substantially aligned with the spiral space of the second spiral conductor when viewed from a direction perpendicular to the plane in which the first spiral conductor lies.

6. A electronic circuit device, comprising:
a substrate; and
an inductor device comprising:
- a first spiral conductor;
- a first external connection terminal formed in an inner peripheral end of said first spiral conductor;
- a second spiral conductor;
- a second external connection terminal formed in an inner peripheral end of said second spiral conductor; and
- a third conductor connecting an outer peripheral end of said first spiral conductor and an outer peripheral end of said second spiral conductor to each other,
- wherein said inductor device is arranged on said substrate, and
- wherein the first and second external connection terminals are formed within regions where the first and second spiral conductors are formed, respectively.

7. The electronic circuit device as claimed in claim 6, wherein the first spiral conductor and the second spiral conductor are formed in a stacked manner via an insulating layer.

8. The electronic circuit device as claimed in claim 7, wherein the first spiral conductor is formed on the substrate.

9. The electronic circuit device as claimed in claim 8, wherein the second spiral conductor is formed by a gold wire.

10. The electronic circuit device as claimed in claim 8, wherein the first spiral conductor is substantially aligned with the spiral space of the second spiral conductor when viewed from a direction perpendicular to the plans in which the first spiral conductor lies.

* * * * *